United States Patent
Harnik et al.

(10) Patent No.: US 9,547,458 B2
(45) Date of Patent: Jan. 17, 2017

(54) INTRA-RACK AND INTER-RACK ERASURE CODE DISTRIBUTION

(71) Applicant: International Business Machines Corporation, Armonk, NY (US)

(72) Inventors: Danny Harnik, Tel Mond, IL (US); Michael Factor, Haifa (IL); Dmitry Sotnikov, Givataim (IL); Paula Ta-Shma, Tel Aviv-Jaffa (IL)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 14/582,227

(22) Filed: Dec. 24, 2014

(65) Prior Publication Data

US 2016/0188406 A1    Jun. 30, 2016

(51) Int. Cl.
G06F 3/06         (2006.01)
G06F 11/10       (2006.01)
H03M 13/15     (2006.01)

(52) U.S. Cl.
CPC ............. *G06F 3/067* (2013.01); *G06F 3/064* (2013.01); *G06F 3/0619* (2013.01); *G06F 11/1088* (2013.01); *H03M 13/154* (2013.01)

(58) Field of Classification Search
CPC .................................................. G06F 11/1076
USPC ........................................... 714/764, 58, 42
See application file for complete search history.

(56) References Cited

U.S. PATENT DOCUMENTS

| | | | |
|---|---|---|---|
| 6,990,573 B2 * | 1/2006 | Cherian | G06F 15/177 709/222 |
| 7,930,611 B2 | 4/2011 | Huang et al. | |
| 8,112,661 B1 * | 2/2012 | La France | G06F 11/2069 714/42 |
| 8,190,974 B2 * | 5/2012 | Gruner | G06F 11/1048 714/758 |
| 8,601,339 B1 | 12/2013 | Cypher | |
| 8,631,269 B2 | 1/2014 | Vinayak et al. | |
| 9,277,010 B2 * | 3/2016 | Venkatesh | H04L 67/1097 |

(Continued)

OTHER PUBLICATIONS

Runhui Li., "Degraded-First Scheduling for MapReduce in Erasure-Coded Storage Clusters", Proceedings of the 44th Annual IEEE/IFIP International Conference on Dependable Systems and Networks (DSN 2014) (Regular paper), Atlanta, Georgia, Jun. 2014.

(Continued)

*Primary Examiner* — Fritz Alphonse
(74) *Attorney, Agent, or Firm* — Daniel Kligler

(57) ABSTRACT

Methods, computing systems and computer program products implement embodiments of the present invention that include detecting multiple sets of storage objects stored in a data facility including multiple server racks, each of the server racks including a plurality of server computers, each of the storage objects in each set being stored in a separate one of the server racks and including one or more data objects and one or more protection objects. A specified number of the storage objects are identified in a given server rack, each of the identified storage objects being stored in a separate one of the server computers, and one or more server computers in the given server rack not storing any of the identified storage objects are identified. Finally, in the identified one or more server computers, an additional protection object is created and managed for the identified storage objects.

17 Claims, 6 Drawing Sheets

(56) References Cited

U.S. PATENT DOCUMENTS

2006/0288183 A1* 12/2006 Boaz ............... G06F 11/1451
            711/164
2010/0138717 A1   6/2010 Wu et al.
2012/0131286 A1*  5/2012 Faith ............... G06F 3/0613
            711/154

OTHER PUBLICATIONS

Shi-Le Zhang., "An Inter-Block 4-Erasure-Correcting Scheme for Reliable Transmission of Large Data Blocks", Computer Supported Cooperative Work in Design (CSCWD), 2010 14th International Conference on Apr. 14-16, 2010, pp. 48-52.

Guangping Xu., "Expander Code: A Scalable Erasure-Resilient Code to Keep up with Data Growth in Distributed Storage", Performance Computing and Communications Conference (IPCCC), 2013 IEEE 32nd International, Dec. 6-8, 2013, pp. 1-9.

* cited by examiner

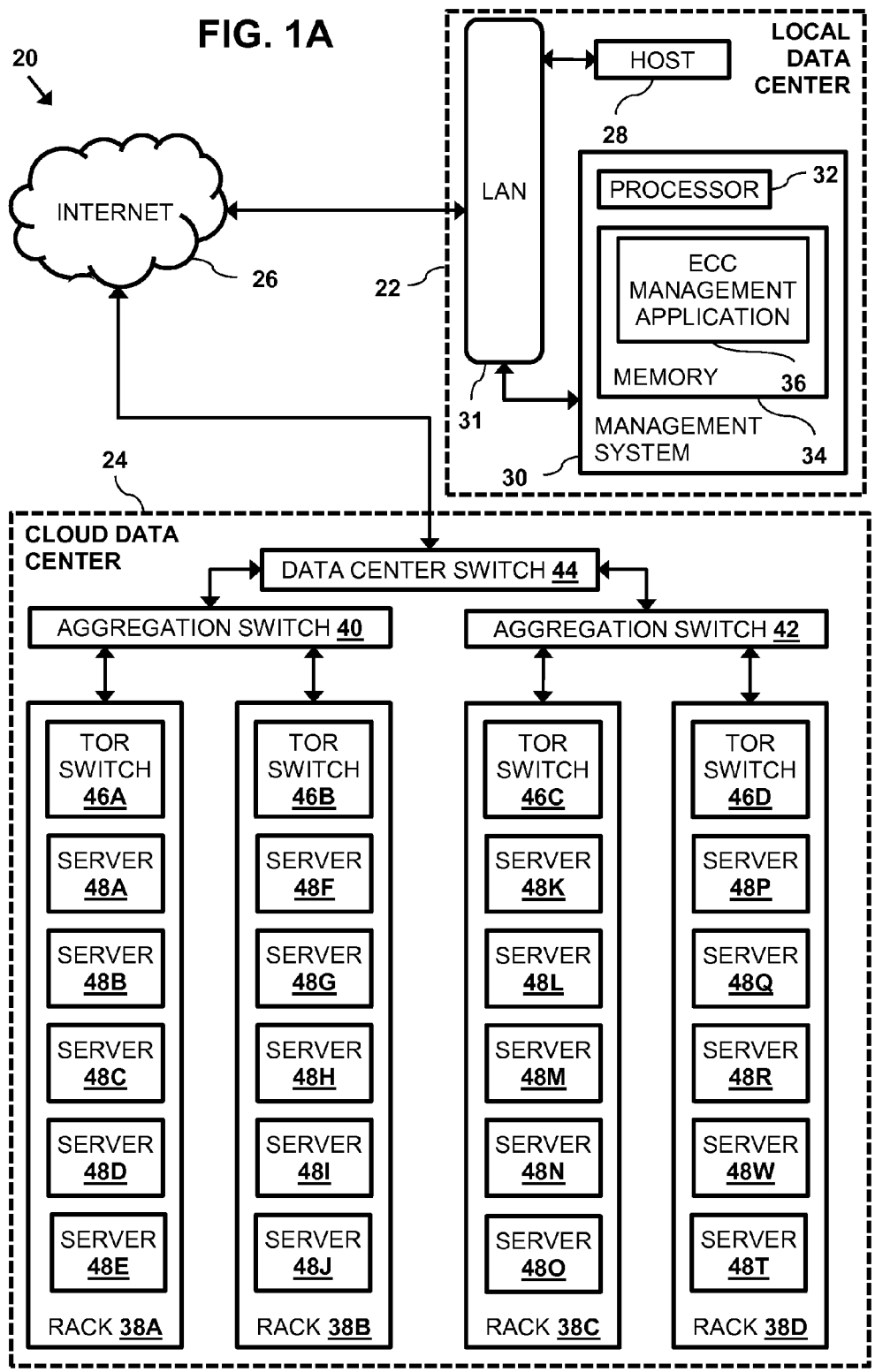

INTRA-RACK AND INTER-RACK ERASURE CODE DISTRIBUTION

FIELD OF THE INVENTION

The present invention relates generally to erasure codes and specifically to local recovery for distributed erasure codes.

BACKGROUND

Erasure coding is a technique used to greatly reduce storage space required to safely store a dataset. For example, compared to three-way data replication that has an overhead of 200% and can survive two failures, a 10:4 Reed-Solomon erasure correction code (which divides the data into ten blocks and adds four parity blocks) has an overhead of 40% and can survive four failures. To maximize survivability, each of the replicas or different blocks of the erasure coded data are placed in different failure domains, where a failure domain at scale would be different racks or even different aisles within a data center. Typically, the distribution of replicas or blocks is implemented in a declustered configuration, in order that that the data on a given storage device can be protected by a large number of other storage devices.

To recover from a failure with simple replication, data from a surviving replica is read. In other words, the amount of data that must be read to recover from a storage device failure (the most common non-transient failure) is the amount of data that was on the failed device. At scale, where a failure domain is a rack, the amount of data that must cross the aggregation network switches between the racks is proportional to the data on the failed drive. By contrast, with k:r erasure coding, the amount of data that must be read and transferred over the aggregation switches is k times the amount of data on the failed device.

The description above is presented as a general overview of related art in this field and should not be construed as an admission that any of the information it contains constitutes prior art against the present patent application.

SUMMARY

There is provided, in accordance with an embodiment of the present invention a method, including detecting multiple sets of storage objects stored in a data facility including multiple server racks, each of the server racks including a plurality of server computers, each of the storage objects in each given set being stored in separate server racks and including one or more data objects and one or more protection objects for the given set, identifying, in a given server rack, a specified number of the storage objects, each of the identified storage objects being stored in separate server computers, identifying one or more server computers in the given server rack not storing any of the identified storage objects, and creating and managing, in the identified one or more server computers, an additional protection object for the identified storage objects.

There is also provided, in accordance with an embodiment of the present invention an storage facility, including multiple server racks, each of the server racks including a plurality of server computers, and a processor configured to detect multiple sets of storage objects, each of the storage objects in each given set being stored in separate server racks and including one or more data objects and one or more protection objects for the given set, to identify, in a given server rack, a specified number of the storage objects, each of the identified storage objects being stored in separate server computers, to identify one or more server computers in the given server rack not storing any of the identified storage objects, and to create and manage, in the identified one or more server computers, an additional protection object for the identified storage objects.

There is further provided, in accordance with an embodiment of the present invention a computer program product, the computer program product including a non-transitory computer readable storage medium having computer readable program code embodied therewith, the computer readable program code including computer readable program code configured to detect multiple sets of storage objects stored in a data facility including multiple server racks, each of the server racks including a plurality of server computers, each of the storage objects in each given set being stored in separate server racks and including one or more data objects and one or more protection objects for the given set, computer readable program code configured to identify, in a given server rack, a specified number of the storage objects, each of the identified storage objects being stored in separate server computers, computer readable program code configured to identify one or more server computers in the given server rack not storing any of the identified storage objects, and computer readable program code configured to create and manage, in the identified one or more server computers, an additional protection object for the identified storage objects.

BRIEF DESCRIPTION OF THE DRAWINGS

The disclosure is herein described, by way of example only, with reference to the accompanying drawings, wherein:

FIGS. 1A-1C are block diagrams of a data facility configured to perform local recovery using distributed erasure correction codes, in accordance with an embodiment of the present invention;

DETAILED DESCRIPTION OF EMBODIMENTS

Overview

Data centers such as cloud data centers typically comprise multiple server racks, wherein each rack comprises multiple server computers, and wherein each of the server computers comprises one or more storage devices. Typically, replication or erasure coding is used to protect individual storage objects on the storage devices. These individual storage objects can be either replicated or divided into storage units (i.e., physical blocks of data), and protected by a set of linear equations performed on data in the storage units.

Each of the server racks typically comprises a plurality of server computers connected to a top-of-rack network switch. The multiple server racks can be connected via an aggregation switch to communicate with server computers in other server racks. Typically, intra rack bandwidth is higher and more plentiful than inter-rack bandwidth.

Embodiments of the present invention provide methods and systems for combining inter-rack (i.e., cross failure zone) erasure coding of individual storage objects using orthogonal inter-object, intra-rack erasure coding. Using orthogonal inter-object, intra-rack erasure coding enables recovering from a single storage failure based upon data stored in the same server rack as the failed storage device. This may reduce the inter-rack bandwidth to a bandwidth that is less than or equal to the bandwidth for replication (i.e., there may be a need to transfer the data via the aggregation switch if the data is to be recovered in a different server rack).

Systems can implement embodiments describe herein with either a small increase in space overhead or a small decrease in resiliency. For example, implementing 10:3 inter-rack resiliency plus one failure intra-rack resiliency can enable as storage facility to survive four storage device failures but only enable the facility to survive three server rack failures.

System Description

Figure 1B:
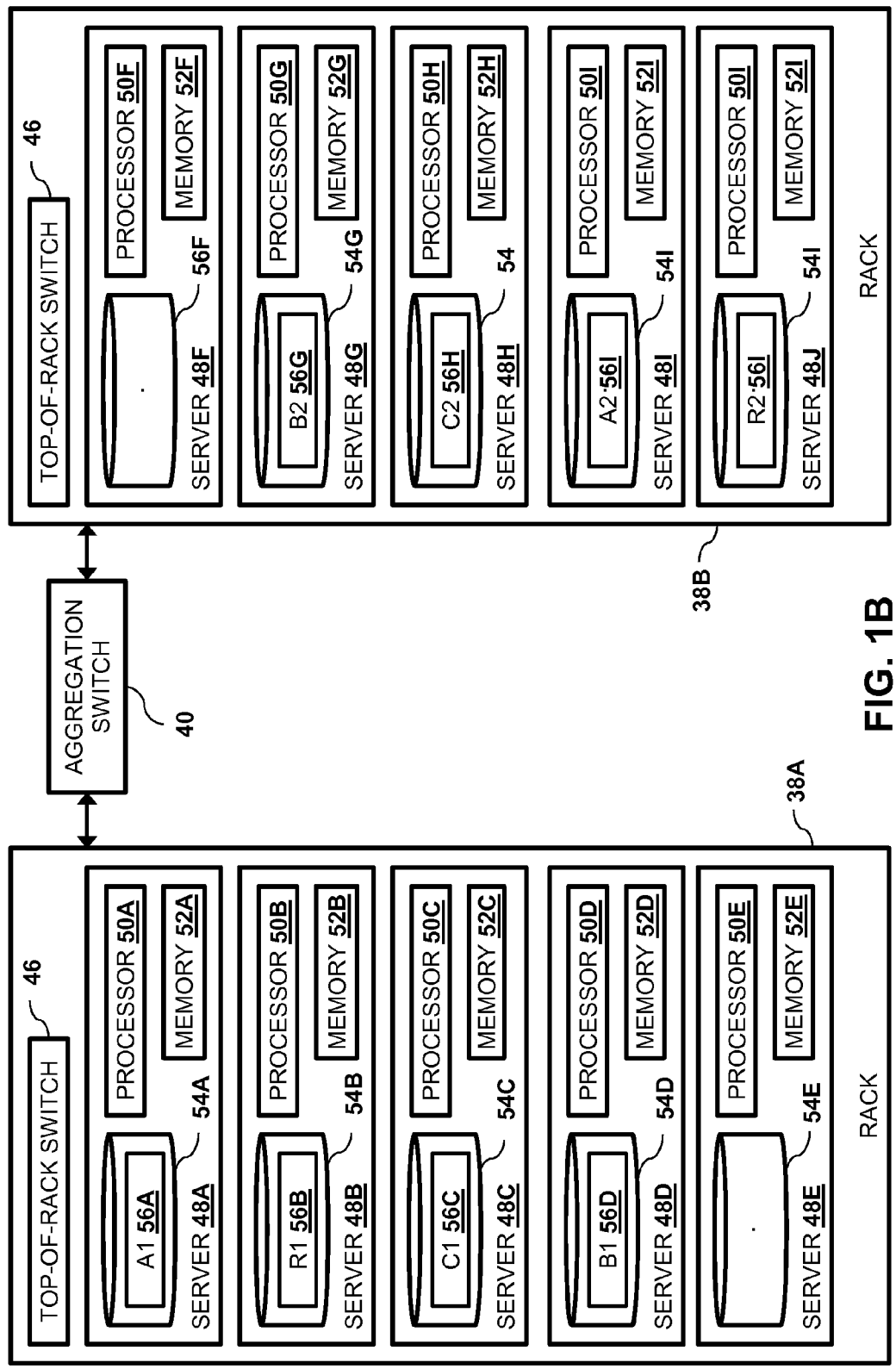
Figure 1C:
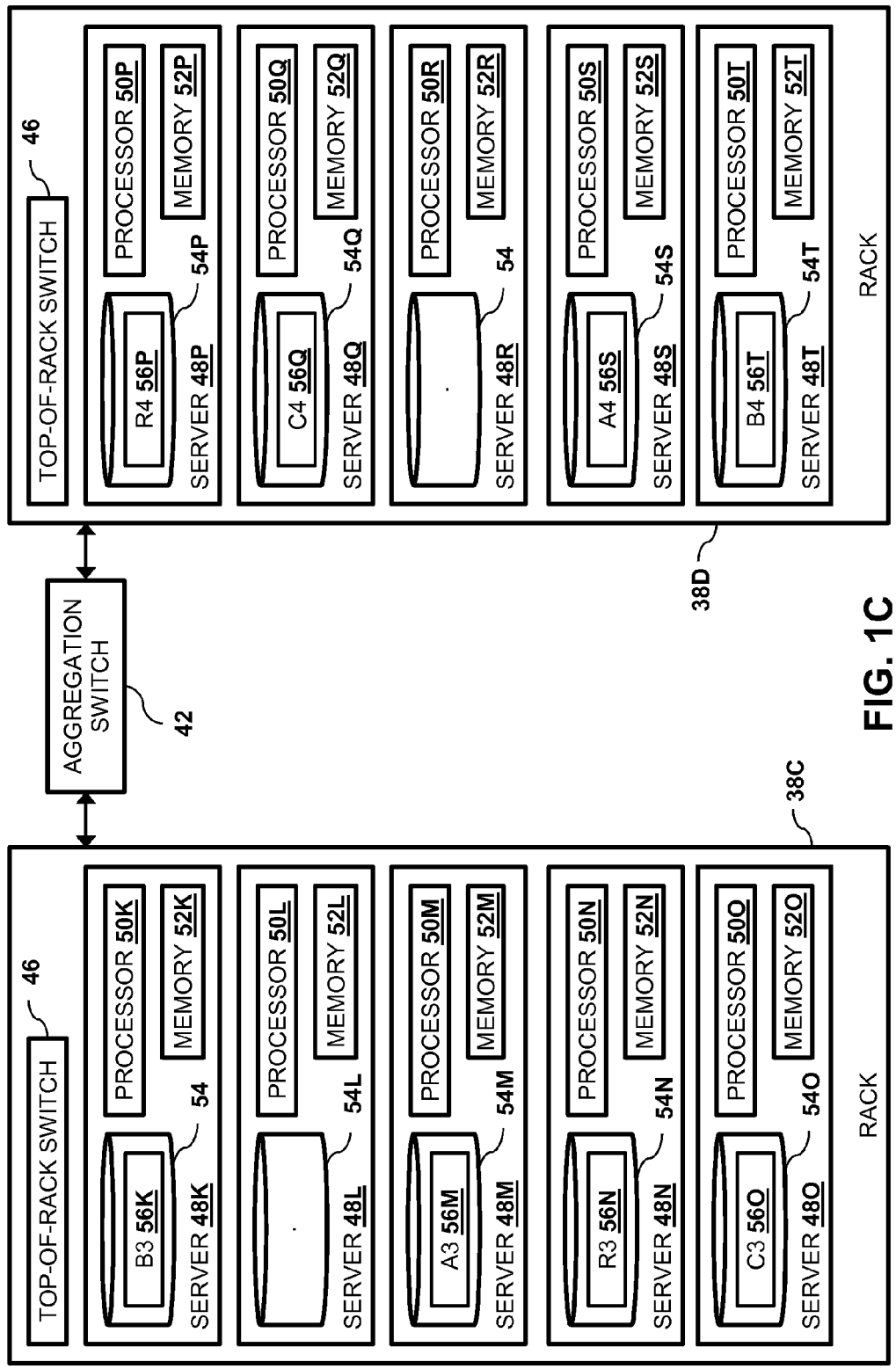

FIGS. 1A-1C, referred to collectively as FIG. 1, are block diagrams of a storage facility 20 configured to perform local recovery using distributed erasure correction codes, in accordance with an embodiment of the present invention. Facility 20 comprises a local data center 22 and a cloud data center 24 that communicate via Internet 26.

Local data center 22 comprises one or more host computers 28 (e.g., database servers and/or e-mail servers) and a management system 30 than communicate via a local area network (LAN) 31. LAN 31 couples local data center 22 to Internet 26.

Management system comprises a management processor 32 and a management memory 34. Processor 32 executes an erasure correction code (ECC) management application 36 from memory 34. In operation, ECC management application 36 manages the distributed erasure correction codes, as described hereinbelow.

Cloud data center 24 comprises multiple server racks 38. In the example shown in FIG. 1, server racks 38 and their respective components can be differentiated by appending a letter to the identifying numeral, so that the server racks comprise server racks 38A-38D. Server racks 38A and 38B communicate via an aggregation switch 40, and server racks 38C and 38D communicate via an aggregation switch 42. Aggregation switches 40 and 42 communicate via a data center switch 44 that also coupled cloud data center 24 to Internet 26.

Each server rack 38 comprises a top-of-rack switch (TOR) 46, and multiple server computers 48. In a given server rack 38, server computers 48 communicate with each other via top-of-rack switch 46, which is also coupled to a given aggregation switch (i.e., switch 40 or 42, depending on the given server rack). Typically intra-rack bandwidth (i.e., bandwidth between two server computers in the same server rack 38 that communicate via switch 46) is higher and more plentiful than inter-rack bandwidth (i.e., bandwidth between two server computers in different server racks 38 that communicate via switch 40).

Each server computer 48 comprises a server processor 50, a server memory 52, and one or more storage devices 54 such as hard disks and solid-state disks that store storage objects 56, which are described in detail hereinbelow. In the configuration shown in FIG. 1, storage device 54A stores storage object 56A that is also referred to herein as storage object A1, storage device 54B stores storage object 56B that is also referred to herein as storage object R1, storage device 54C stores storage object 56C that is also referred to herein as storage object C1, storage device 54D stores storage object 56D that is also referred to herein as storage object B1, storage device 54G stores storage object 56G that is also referred to herein as storage object B2, storage device 54H stores storage object 56H that is also referred to herein as storage object C2, storage device 54I stores storage object 56I that is also referred to herein as storage object A2, storage device 54J stores storage object 56H that is also referred to herein as storage object R2, storage device 54K stores storage object 56K that is also referred to herein as storage object B3, storage device 54M stores storage object 56M that is also referred to herein as storage object A3, storage device 54N stores storage object 56N that is also referred to herein as storage object R3, storage device 54O stores storage object 56O that is also referred to herein as storage object C3, storage device 54P stores storage object 56P that is also referred to herein as storage object R4, storage device 54Q stores storage object 56Q that is also referred to herein as storage object C4, storage device 54S stores storage object 56S that is also referred to herein as storage object A4, and storage device 54T stores storage object 56T that is also referred to herein as storage object B4.

In the example shown in FIG. 1, there are three objects A (comprising storage objects A1-A4), B (comprising storage objects B1-B4) and C (comprising storage objects C1-C4), and cloud data center 24 implements an inter-rack 2:2 erasure code so that each of the objects comprises two data objects and two protection objects. While the example in FIG. 1 shows an inter-rack 2:2 erasure code for sake of simplicity, any k:r code is considered to be within the spirit and scope of the present invention.

As described in the description referencing FIGS. 2 and 3 hereinbelow, storage objects 56 storing user data may also be referred to herein as data objects 56, and storage objects storing protection data such as erasure correction codes may also be referred to herein as protection objects 56. Additionally, protection objects 56 that protect storage objects that are stored in different server racks 38 may also be referred to herein as inter-rack protection objects 56, and protection objects 56 that protect storage objects that are stored in different server computers 48 in a given server rack 38 may also be referred to herein as intra-rack protection objects 56.

Therefore, in the example:
  Storage objects A1 and A2 are the two data objects 56 of object A, and A3 and storage objects A4 are the two protection objects 56 (e.g., parity blocks) of object A.
  Storage objects B1 and B2 are the two data objects 56 of object B, and storage objects B3 and B4 are the two protection objects 56 of object B.

Storage objects C1 and C2 are the two data objects 56 of object C, and storage objects C3 and C4 are the two protection objects 56 of object C.

To enable recovery of a single failed storage object without resulting in extensive inter-rack communication, embodiments of the present invention add an intra-rack protection object $R_N$ (i.e., a given protection object 56), which processor 32 can construct from a linear function of a collection of storage objects 56 within a given server rack 38 so that all of the storage objects are on different server computers 48 (i.e., different storage devices 54). To recover from a single failure of a given server computer 48 or a given storage device 54 (e.g., storage device 54C containing storage object C1), processor 32 can read storage objects A1, R1, and B1, apply the inverse of the linear function used to construct protection object R1, thereby rebuilding storage object C1. While rebuilding storage object C1, the only inter-rack communication required is if the rebuilt storage object C1 should be placed on another rack.

In order to protect against a failure of a given server computer 48, the storage objects in a given server rack 38 that are combined using a linear function to create a given inter-rack protection object 56 typically need to reside on distinct server computers 48.

Additionally, if the protection objects comprise any linear codes (e.g. Reed Solomon codes), the codes typically need to have the same size. In systems where this is not the case, this can be handled in a different ways, for example (a) padding the smaller storage objects 56 to bring them to the same size as the others, since zero padding does not change the storage object's parity and can be implemented with negligible increase of physical footprint, and/or (b) combining smaller storage objects 56 to make a larger storage object 56, (i.e., since a bin packing algorithm can be used to do this efficiently in terms of space usage or other factors).

Furthermore, the width of a given intra-rack protection object 56 may be less than or equal to the number of server computers in a given server rack 38.

Figure 2:
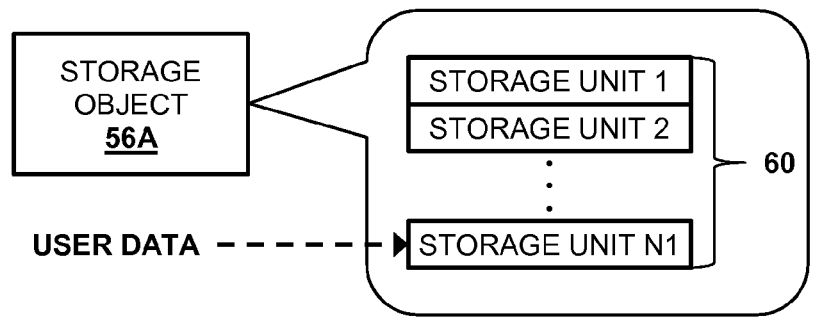
FIG. 2 is a block diagram detailing a first given storage object stored in the data facility and configured as a data object, in accordance with a first embodiment of the present invention.
Figure 3:
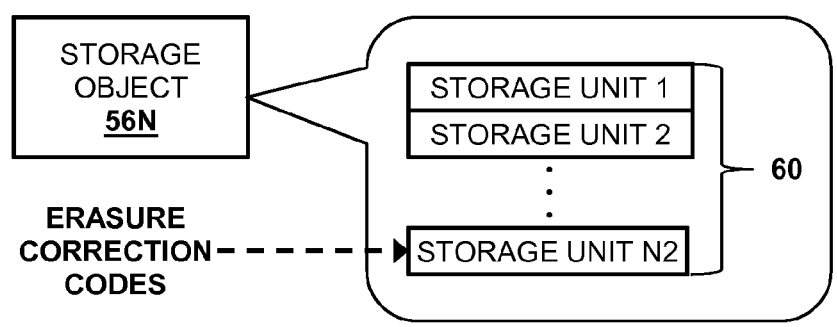
FIG. 3 is a block diagram detailing a second given storage object stored in the data facility and configured as a protection object, in accordance with a second embodiment of the present invention.

FIG. 2 is a block diagram detailing storage object 56A, in accordance with a first embodiment of the present invention, and FIG. 3 is a block diagram detailing storage object 56N, in accordance with a second embodiment of the present invention. Storage objects 56 comprise multiple storage units 60 that comprise physical blocks of data on storage devices 54. Since storage units 60 in storage object 56A comprise user data, storage object 56A may also be referred to as data object 56A. Likewise, since storage units 60 storage object 56N comprise erasure correction codes, storage object 56N may also be referred to as protection object 56N.

In operation, processor 32 manages a given protection object 56 for multiple storage objects 56 by calculating an erasure correction codes for corresponding contents in the multiple storage objects. For a given data object 56, the contents comprise user data, and for a given protection object 56, the contents comprise erasure correction codes.

While embodiments herein describe protection objects 56 using erasure correction codes, other error correction mechanism are considered to be within the spirit and scope of the present invention. For example a given protection object 56 (i.e., either intra-rack or inter-rack) may comprise a replication of a given data object.

In embodiments described herein, processor 32 creates and manages intra-rack protection objects 56. In some embodiments, local data center 22 can configure management system 30 to intercept write request from host computer 28, and update the intra-rack protection objects 56 as necessary. In alternative embodiments, processor 32 can monitor data objects 56, and update intra-rack protection objects 56 as necessary. In further embodiments, the functionality of management system 30 can be performed by a given server processor 50, or by a virtual machine instance executing in a given memory 52. Additionally, while embodiments herein describe creating a single intra-rack protection object 56 for a given server rack 38, creating and managing multiple intra-rack protection objects for a given server rack 38 is considered to be within the spirit and scope of the present invention.

Processors 32 and 50 typically comprise general-purpose computer, which are programmed in software to carry out the functions described herein. The software may be downloaded to system 22 and server computers 48 in electronic form, over a network, for example, or it may be provided on non-transitory tangible media, such as optical, magnetic or electronic memory media. Alternatively, some or all of the functions of processors 32 and 50 may be carried out by dedicated or programmable digital hardware components, or using a combination of hardware and software elements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Intra-Rack Erasure Correction Codes

Figure 4:
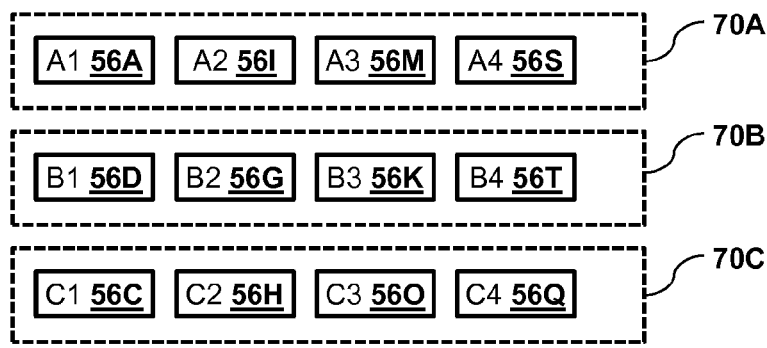
FIG. 4 is a block diagram showing sets of the storage objects stored in the storage facility, in accordance an embodiment of the present invention.

FIG. 4 is a block diagram showing sets 70 of the storage objects stored in the storage facility, in accordance an embodiment of the present invention. In the example shown in FIG. 4, sets can be differentiated by appending a letter to the identifying numeral, so that the sets comprise server racks 70A-70C.

Set 70A represents object A and comprises storage objects A1, A2, A3 and A4. Set 70B represents object B and comprises storage objects B1, B2, B3 and B4. Set 70C represents object C and comprises storage objects C1, C2, C3 and C4. As described supra, storage objects A1, A2, B1, B2, C1, and C2 comprise data objects 56, and storage objects A3, A4, B3, B4, C3, and C4 comprise (inter-rack) protection objects 56.

Figure 5:
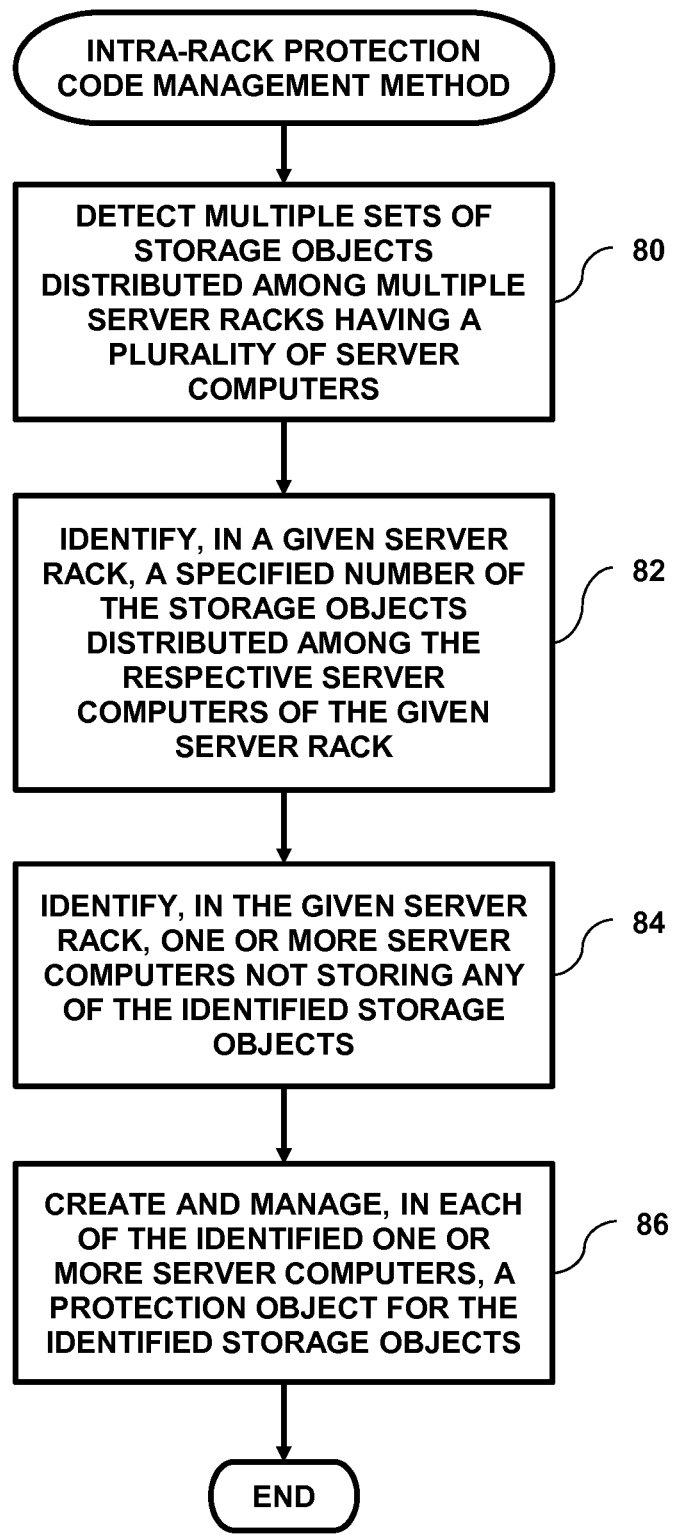
FIG. 5 is a flow diagram that schematically illustrates a method of creating and managing intra-rack erasure correction codes in the data facility, in accordance an embodiment of the present invention.

FIG. 5 is a flow diagram that schematically illustrates a method of creating and managing intra-rack protection objects 56, in accordance an embodiment of the present invention. In a detection step 80, processor 32 detects multiple sets 70. As described supra, each set 70 comprises one or more data objects 56 and one or more protection objects 56, each of the data and the protection objects stored on separate server racks 38. For example, set 70A comprises data object 56A that is stored in server rack 38A, data object 56B that is stored in server rack 38B, data object 56C that is stored in server rack 38C, and data object 56D that is stored in server rack 38D. Protection objects 56C and 56D protect 70A. In other words, if a given storage object 56 in set 70A cannot be read, then contents of the given storage object can be recovered using data stored the other storage objects in set 70A.

In a first identification step 82, processor 32 identifies, in a given server rack 38, a specified number of storage objects that are stored in separate server computers in the given server rack. For example, if the specified number is three and the given server rack is server rack 38A, then the identified storage objects comprise storage objects A1, B1 and C1.

In a second identification step 84, processor 32 identifies, in the given server rack, one or more server computers 48 not storing any of the identified storage objects. For example, in the configuration shown in FIG. 1, processor 32 can identify either server computer 48B or server computer 48E. Finally, in a creation step 86, using embodiments described herein, processor 32 creates and manages, on each of the one or more identified server computers, an additional protection object 56 that is configured to protect the identified storage objects, and the method ends. To create the one or more additional protection objects, processor 32 calculates erasure correction codes based on contents of the identified storage objects, and to manage the one or more additional protection objects, the management processor updates the erasure correction codes upon detecting any changes to the identified storage objects.

The additional protection object protects the identified storage objects in the given rack. For example, in rack 38A, protection object R1 protects storage objects A1, B1, C1 and D1, and storage objects A1, B1, C1, D1 and E1 can be referred to as a rack set. Therefore, if a given storage object 56 in the rack set cannot be read, contents of the given storage object can be recovered using data stored in the other storage objects 56 in the rack set.

Figure 6:
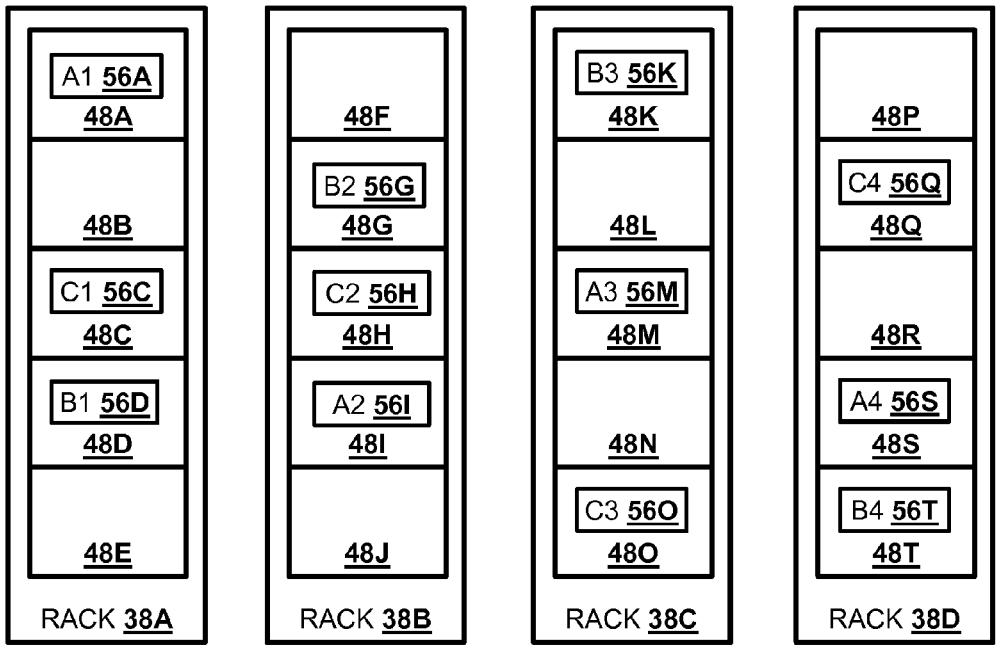
FIG. 6 is a block diagram showing a first distribution of the storage objects among server computers in the data facility prior to creating intra-rack protection objects, in accordance with an embodiment of the present invention.

FIG. 6 is a block diagram showing a first distribution of storage objects 56 among server computers 48 prior to performing the steps described in FIG. 5, in accordance with an embodiment of the present invention. In FIG. 6, the storage objects comprise sets 70A, 70B and 70C.

Figure 7:
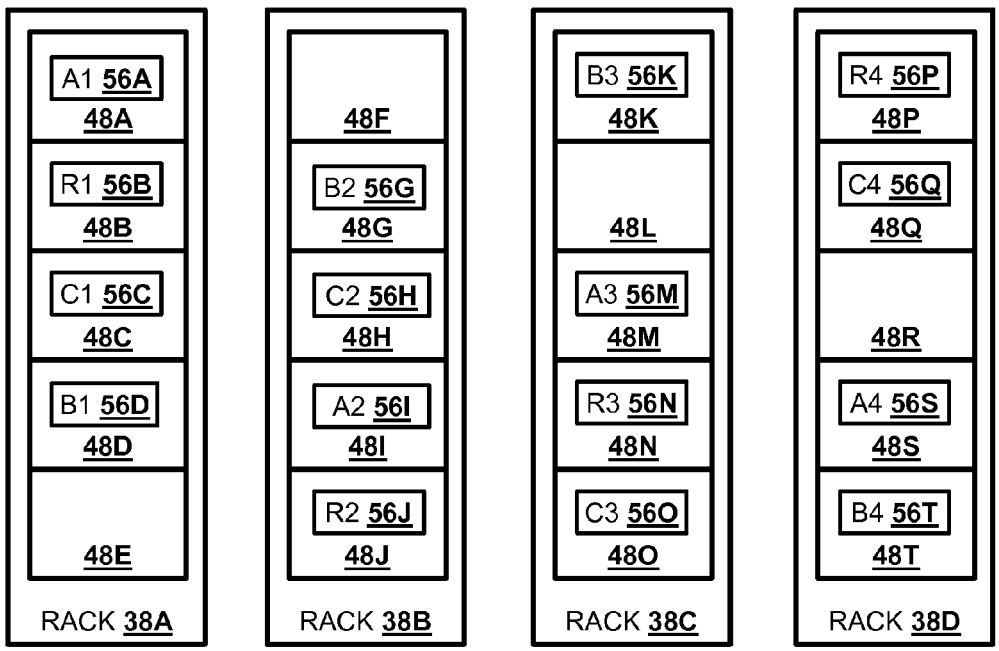
FIG. 7 is a block diagram showing a second distribution of the storage objects among the server computers in the data facility subsequent to creating intra-rack protection objects, in accordance with an embodiment of the present invention.

FIG. 7 is a block diagram showing a second distribution of storage objects 56 among server computers 48 in the data facility subsequent to performing the steps described in FIG. 5, in accordance with an embodiment of the present invention. In addition to sets 70A-70C, FIG. 7 shows protection objects R1, R2, R3 and R4 stored in each server rack 38.

In operation, processor 32 can maintain a list of storage objects within each rack 38 that are candidates for intra-rack erasure coding, including their sizes and respective server computers 48 and/or storage devices 54. Facility 20 can maintain a "rack candidate list" using centralized or distributed logic.

In some embodiments, processor 32 can create the additional intra-rack parity objects can be created in a "lazy" manner, because while their presence reduces the amount of inter-rack communication needed for recovery, recovery is possible without them. Therefore, processor 32 does not need to create the additional intra-rack protection objects created immediately, (or at all), and can be created in any of the following scenarios:

Processor 32 detects a suitable set of similarly sized storage units 60 available on a distinct server computer 48.

Processor 32 detects sufficient system resources to read the storage objects, compute the erasure correction codes and store the computed codes.

Processor 32 determines if workload parameters suggest that creating the intra-rack protection objects is beneficial to the facility.

Another enhancement for "lazy" intra-rack parity creation comprises supporting both lazy and immediate protection object creation. Processor 32 can use the lazy mechanism will be used as a default, but in case of data compromise in the cloud data center, the management processor can upgrade some of the protection object creation operations to be performed immediately.

For example, if a failure occurred in a first server rack (e.g., rack 38A) before processor 32 created intra-rack protection object R1, then processor 32 can regenerate the missing data form a second server rack 38 (e.g., rack 38B). At this point, processor 32 can quickly upgrade the internal parity creation of any relevant storage objects 56 in the second server rack, thereby reducing a probability of data loss due to a potential failure in the second server rack. Note that this expedited protection block creation should not interfere with the recovery of data to the first rack, since both processes attempt to read the same affected data from a given storage device in the second rack, and thus can "piggyback" their respective reads.

In operation, intra-rack protection is based upon data that is independent from any inter-rack parity protection. Therefore, the same logic in ECC management application 36 can be used for both intra-rack and inter-rack protection without loss of redundancy.

In some embodiments, overwriting or migrating given storage object 56 is equivalent to deleting the given storage object and creating a new storage object. If a given storage object 56 is deleted, may result in its respective erasure correction codes in a given inter-rack protection object 56 also being deleted. However, since each of these inter-rack blocks now also belongs to given intra-rack protection object 56. To handle this situation, processor 32 can perform one of the following alternative operations:

"A". Abandon the given intra-rack protection object, delete the protection object's erasure correction codes, and return the other erasure correction codes that were in the given intra-rack protection object to the server rack's candidate list.

"B". Maintain the given intra-rack protection object, mark the given protection object's storage units 60 as deleted but retain the given protection object's erasure correction codes to support the other storage objects 56 in the codes.

"C". Apply operation "A" described hereinabove if a certain percentage of the erasure correction codes in the given protection object have been deleted. Otherwise apply operation "B" described hereinabove.

"D". Place the intra-rack given protection object on a list for rebuilding. Therefore, when new additional storage objects 56 (i.e., storage units 60) are available on a given storage device 54 that previously stored the deleted storage object, use the new storage objects as a replacement for the intra-rack protection object.

"E". Replace the deleted storage objects with a known fixed byte sequence and delete the storage object. This reduces the efficiency of the intra-rack encoding but does not "waste" space for storing a deleted storage object 56.

These alternative operations typically trade off space usage for CPU and I/O resources. Additionally, in order to improve reliability, multiple policies can be defined for prioritizing the inclusion of storage objects 56 into a given intra-rack protection object. These policies may include:

Assigning higher importance to frequently accessed data objects 56.

Assigning higher importance to de-duplicated storage objects 56, since losing a given de-duplicated storage objects 56 may result in losing all the storage objects that refer to it.

User-specific service level agreements (SLAs) can be used for prioritization.

The flowchart(s) and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method, comprising:
   detecting, by a management processor, multiple sets of storage objects stored in a data facility comprising multiple server racks, each of the server racks comprising a plurality of server computers, each of the storage objects in each given set being stored in separate server racks and comprising one or more data objects and one or more protection objects for the given set;

identifying, by the management processor, in a given server rack, a specified number of the storage objects, each of the identified storage objects being stored in separate server computers;

identifying by the management processor, one or more server computers in the given server rack not storing any of the identified storage objects; and creating and managing, by the management processor, in the identified one or more server computers, an additional protection object for the identified storage objects, wherein the additional protection object comprises erasure correction codes for corresponding contents of each of the identified storage objects.

2. The method according to claim 1, wherein the additional protection object comprises a replicated storage object.

3. The method according to claim 1, wherein the corresponding contents of a given identified data object comprises user data.

4. The method according to claim 1, wherein the erasure correction codes comprise first erasure correction codes, and wherein the corresponding contents of a given identified protection object comprises second erasure correction codes.

5. The method according to claim 1, wherein the multiple server racks are coupled via one or more first network switches having one or more respective first bandwidths, and wherein each of the server computers in a given server rack are coupled via a second network switch having a second bandwidth, and wherein the second bandwidth is greater than each of the one or more first bandwidths, and wherein the second bandwidth is more plentiful than the first bandwidth.

6. The method according to claim 5, wherein each of the one or more first communication switches are selected from a list consisting of a data center switch and an aggregation switch, and wherein the second communication switch comprises a top-of-rack switch.

7. A storage facility, comprising:
multiple server racks, each of the server racks comprising a plurality of server computers; and
a processor configured:
to detect multiple sets of storage objects, each of the storage objects in each given set being stored in separate server racks and comprising one or more data objects and one or more protection objects for the given set,
to identify, in a given server rack, a specified number of the storage objects, each of the identified storage objects being stored separate server computers,
to identify one or more server computers in the given server rack not storing any of the identified storage objects, and
to create and manage, in the identified one or more server computers, an additional protection object for the identified storage objects,
wherein the additional protection object comprises erasure correction codes for corresponding contents of each of the identified storage objects.

8. The storage facility according to claim 7, wherein the additional protection object comprises a replicated storage object.

9. The storage facility according to claim 7, wherein the corresponding contents of a given identified data object comprises user data.

10. The storage facility according to claim 7, wherein the erasure correction codes comprise first erasure correction codes, and wherein the corresponding contents of a given identified protection object comprises second erasure correction codes.

11. The storage facility according to claim 7, wherein the multiple server racks are coupled via one or more first network switches having one or more respective first bandwidths, and wherein each of the server computers in a given server rack are coupled via a second network switch having a second bandwidth, and wherein the second bandwidth is greater than each of the one or more first bandwidths, and wherein the second bandwidth is more plentiful than the first bandwidth.

12. The storage facility according to claim 11, wherein each of the one or more first communication switches are selected from a list consisting of a data center switch and an aggregation switch, and wherein the second communication switch comprises a top-of-rack switch.

13. A computer program product, the computer program product comprising:
a non-transitory computer readable storage medium having computer readable program code embodied therewith, the computer readable program code comprising:
computer readable program code configured to detect multiple sets of storage objects stored in a data facility comprising multiple server racks, each of the server racks comprising a plurality of server computers, each of the storage objects in each given set being stored in separate server racks and comprising one or more data objects and one or more protection objects for the given set;
computer readable program code configured to identify, in a given server rack, a specified number of the storage objects, each of the identified storage objects being stored in separate server computers;
computer readable program code configured to identify one or more server computers in the given server rack not storing any of the identified storage objects; and
computer readable program code configured to create and manage, in the identified one or more server computers, an additional protection object for the identified storage objects,
wherein the additional protection object comprises erasure correction codes for corresponding contents of each of the identified storage objects.

14. The computer program product according to claim 13, wherein the additional protection object comprises a replicated storage object.

15. The computer program product according to claim 13, wherein the corresponding contents of a given identified data object comprises user data.

16. The computer program product according to claim 13, wherein the erasure correction codes comprise first erasure correction codes, and wherein the corresponding contents of a given identified protection object comprises second erasure correction codes.

17. The computer program product according to claim 13, wherein the multiple server racks are coupled via one or more first network switches having one or more respective first bandwidths, and wherein each of the server computers in a given server rack are coupled via a second network switch having a second bandwidth, and wherein the second bandwidth is greater than each of the one or more first bandwidths, and wherein the second bandwidth is more plentiful than the first bandwidth, and wherein each of the one or more first communication switches are selected from a list consisting of a data center switch and an aggregation switch, and wherein the second communication switch comprises a top-of-rack switch.

\* \* \* \* \*